US010599803B2

(12) United States Patent
Yamamoto

(10) Patent No.: US 10,599,803 B2
(45) Date of Patent: Mar. 24, 2020

(54) HIGH LEVEL SYNTHESIS APPARATUS, HIGH LEVEL SYNTHESIS METHOD, AND COMPUTER READABLE MEDIUM

(71) Applicant: MITSUBISHI ELECTRIC CORPORATION, Tokyo (JP)

(72) Inventor: Ryo Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 8 days.

(21) Appl. No.: 16/061,442

(22) PCT Filed: Mar. 10, 2016

(86) PCT No.: PCT/JP2016/057668
§ 371 (c)(1),
(2) Date: Jun. 12, 2018

(87) PCT Pub. No.: WO2017/154183
PCT Pub. Date: Sep. 14, 2017

(65) Prior Publication Data
US 2019/0303513 A1    Oct. 3, 2019

(51) Int. Cl.
*G06F 17/50* (2006.01)
(52) U.S. Cl.
CPC ............ *G06F 17/505* (2013.01); *G06F 17/50* (2013.01)
(58) Field of Classification Search
CPC .................................................... G06F 17/505
(Continued)

(56) References Cited

U.S. PATENT DOCUMENTS 5,519,627 A * 5/1996 Mahmood ........... G06F 17/5045
716/103
5,841,663 A * 11/1998 Sharma ............... G06F 17/5045
716/104
(Continued)

FOREIGN PATENT DOCUMENTS

JP      2012-79233 A     4/2012
JP      2013-235474 A    11/2013
(Continued)

OTHER PUBLICATIONS

International Search Report (PCT/ISA/210) issued in PCT/JP2016/057668, dated Jun. 7, 2016.
(Continued)

*Primary Examiner* — Suchin Parihar
(74) *Attorney, Agent, or Firm* — Birch, Stewart, Kolasch & Birch, LLP.

(57) ABSTRACT

A structure determination unit (112) obtains an operational description (511) and determines a candidate of a circuit structure applicable to a plurality of execution units as a structure candidate, the operational description (511) describing an operation of a circuit and including the plurality of execution units. A decision unit (113) calculates, as a circuit characteristic (522), a characteristic of the circuit when the circuit structure of the plurality of execution units is the structure candidate and outputs the structure candidate as a determined circuit structure (310) when the circuit characteristic (522) meets a threshold (521). A high level synthesis unit (140) performs high level synthesis on the operational description (511) so that the circuit structure of the plurality of execution units becomes the determined circuit structure (310).

9 Claims, 12 Drawing Sheets

(58) Field of Classification Search
USPC .......................................................... 716/104
See application file for complete search history.

(56) References Cited

U.S. PATENT DOCUMENTS

| | | | | |
|---|---|---|---|---|
| 6,941,541 | B2* | 9/2005 | Snider | G06F 17/5045 |
| | | | | 716/103 |
| 8,464,190 | B2* | 6/2013 | Bower | G06F 9/30079 |
| | | | | 716/106 |
| 8,839,255 | B2* | 9/2014 | Memik | G06F 9/3851 |
| | | | | 711/151 |
| 10,380,063 | B2* | 8/2019 | Tang | G06F 15/7892 |
| 2002/0023256 | A1* | 2/2002 | Seawright | G06F 17/5045 |
| | | | | 716/105 |
| 2004/0163053 | A1* | 8/2004 | Snider | G06F 17/5045 |
| | | | | 716/103 |
| 2012/0036138 | A1 | 2/2012 | Carrion | |
| 2012/0216019 | A1* | 8/2012 | Bower | G06F 9/30079 |
| | | | | 712/201 |
| 2013/0091482 | A1 | 4/2013 | Carrion | |
| 2013/0346929 | A1 | 12/2013 | Toi et al. | |
| 2016/0042099 | A1 | 2/2016 | Toi et al. | |
| 2018/0189110 | A1* | 7/2018 | Venkatesh | G06F 15/8092 |
| 2019/0303513 | A1* | 10/2019 | Yamamoto | G06F 17/50 |

FOREIGN PATENT DOCUMENTS

| | | |
|---|---|---|
| JP | 2014-6650 A | 1/2014 |
| JP | 5516596 B2 | 4/2014 |
| JP | 2014-174940 A | 9/2014 |
| JP | 5605435 B2 | 9/2014 |
| JP | 2015-95130 A | 5/2015 |

OTHER PUBLICATIONS

Schafer et al., "Design Space Exploration Acceleration Through Operation Clustering", IEEE Transactions on Computer-Aided Design of Integrated Circuits and Systems, vol. 29, No. 1, Jan. 2010, pp. 153-157.

VAST Lab, Computer Science Department, UCLA "CMOST FPGA Synthesis User Guide v2014.08", Total 44 Pages.

* cited by examiner

151 : SOURCE CODE

```
#define SIZE 1024
#define TYPE int
void func(TYPE *a, TYPE *c, int foo, int thr) {
  TYPE sum = 0;
  TYPE b[SIZE];
F1:
  for(int i = 0; i < SIZE; i++) {
    tmp = a[i];
    b[i] = tmp * foo;
    if(tmp>thr) sum++;
  }
F2:
  for(int i = 0; i < SIZE-1; i++) {
    c[i] = (b[i] + b[i+1])/sum,
  }
}
```

515

51 : SYNTHESIS RESULT

| # | LOGIC_LAT | AREA |
|---|---|---|
| F1 | 2 | 100 |
| F2 | 4 | 200 |

Fig. 6

CALCULATION EXPRESSION 31
(EXECUTION UNIT CALCULATION EXPRESSION 3131)
(LATENCY OF EXECUTION UNIT)

| # | TYPE | LOOP PERFORMANCE CALCULATION EXPRESSION (LATENCY) |
|---|---|---|
| 1 | NON-PIPELINE | LOOP * LOGIC_LAT |
| 2 | PARALLEL | LOOP/N * LOGIC_LAT |
| 3 | PIPELINE | LOOP * DII + LOGIC_LAT |
| 4 | PIPELINE + PARALLEL | LOOP/N + LOGIC_LAT |

Fig. 7

CALCULATION EXPRESSION 31
(CIRCUIT STRUCTURE CALCULATION EXPRESSION 3132)
(LATENCY OF CIRCUIT STRUCTURE)

| TYPE | LATENCY PERFORMANCE CALCULATION EXPRESSION |
|---|---|
| SERIAL TYPE | $\Sigma (FN_{Cycle})$ |
| PARALLEL TYPE (BASIC FORM) | $\Sigma (FN_{Cycle})$ |
| PARALLEL TYPE (DELAY FORM) | $\Sigma Delay_{n-1, n} + FN_{Cycle}$ |

Fig. 8

CALCULATION EXPRESSION 31
(DT CALCULATION EXPRESSION 3133)
(DT OF CIRCUIT STRUCTURE)

| TYPE | DT PERFORMANCE CALCULATION EXPRESSION |
|---|---|
| SERIAL TYPE | $\Sigma (FN_{Cycle})$ |
| PARALLEL TYPE (BASIC FORM) | $Max (F1_{Cycle}, F2_{Cycle}, ..)$ |
| PARALLEL TYPE (DELAY FORM) | $FN_{Cycle}$ |

Fig. 9

52: NON-FUNCTIONAL REQUIREMENT RESULT
(SERIAL TYPE, FIRST TIME)

| COMBINATION | | F1 | | | F2 | | | PERFORMANCE | |
| --- | --- | --- | --- | --- | --- | --- | --- | --- | --- |
| F1 | F2 | loop | LOGIC_LAT | Fcycle | loop | LOGIC_LAT | Fcycle | DT | Total Latecy |
| NON-PIPELINE | NON-PIPELINE | 1024 | 2 | 2048 | 1023 | 4 | 4092 | 6140 | 6140 |
| NON-PIPELINE | PIPELINE | 1024 | 2 | 2048 | 1023 | 4 | 1027 | 3075 | 3075 |
| PIPELINE | NON-PIPELINE | 1024 | 2 | 1026 | 1023 | 4 | 4092 | 5118 | 5118 |
| PIPELINE | PIPELINE | 1024 | 2 | 1026 | 1023 | 4 | 1027 | 2053 | 2053 |

Fig. 10

52: NON-FUNCTIONAL REQUIREMENT RESULT (PARALLEL TYPE, FIRST TIME)

| COMBINATION | | F1 | | | F2 | | | PERFORMANCE | |
|---|---|---|---|---|---|---|---|---|---|
| F1 | F2 | loop | LAT | Loop_LAT | loop | LAT | Loop_LAT | DFIT | Total Latecy |
| NON-PIPELINE | NON-PIPELINE | 1024 | 2 | 2048 | 512 | 4 | 2046 | 2048 | 2048 |
| NON-PIPELINE | PIPELINE | 1024 | 2 | 2048 | 512 | 4 | 516 | 2048 | 2048 |
| PIPELINE | NON-PIPELINE | 1024 | 2 | 1026 | 512 | 4 | 2046 | 2046 | 2046 |
| PIPELINE | PIPELINE | 1024 | 2 | 1026 | 512 | 4 | 516 | 1024 | 1024 |

Fig. 11

52: NON-FUNCTIONAL REQUIREMENT RESULT (SERIAL TYPE, SECOND TIME)

| COMBINATION | | F1 | | | F2 | | | PERFORMANCE | |
|---|---|---|---|---|---|---|---|---|---|
| F1 | F2 | loop | LOGIC_LAT | Fcycle | loop | LOGIC_LAT | Fcycle | DT | Total Latecy |
| NON-PIPELINE | NON-PIPELINE | 1024 | 2 | 2048 | 512 | 4 | 2046 | 4094 | 4094 |
| NON-PIPELINE | PIPELINE | 1024 | 2 | 2048 | 512 | 4 | 516 | 2564 | 2564 |
| PIPELINE | NON-PIPELINE | 1024 | 2 | 1026 | 512 | 4 | 2046 | 3072 | 3072 |
| PIPELINE | PIPELINE | 1024 | 2 | 1026 | 512 | 4 | 516 | 1542 | 1542 |

Fig. 12

52: NON-FUNCTIONAL REQUIREMENT RESULT (PARALLEL TYPE, SECOND TIME)

| COMBINATION | | F1 | | | F2 | | | PERFORMANCE | |
|---|---|---|---|---|---|---|---|---|---|
| F1 | F2 | loop | LOGIC_LAT | Fcycle | loop | LOGIC_LAT | Fcycle | DT | Total Latecy |
| NON-PIPELINE | NON-PIPELINE | 1024 | 2 | 2048 | 512 | 4 | 2046 | 2048 | 2048 |
| NON-PIPELINE | PIPELINE | 1024 | 2 | 2048 | 512 | 4 | 516 | 2048 | 2048 |
| PIPELINE | NON-PIPELINE | 1024 | 2 | 1026 | 512 | 4 | 2046 | 2046 | 2046 |
| PIPELINE | PIPELINE | 1024 | 2 | 1026 | 512 | 4 | 516 | 1024 | 1024 |

Fig. 13

52 : NON-FUNCTIONAL REQUIREMENT RESULT (SERIAL TYPE, THIRD TIME)

| COMBINATION | | F1 | | | F2 | | | PERFORMANCE | |
|---|---|---|---|---|---|---|---|---|---|
| F1 | F2 | loopLOGIC_LAT | LOGIC_LAT | Fcycle | loopLOGIC_LAT | LOGIC_LAT | Fcycle | DT | Total Latecy |
| NON-PIPELINE | NON-PIPELINE | 512 | 2 | 1024 | 512 | 4 | 2046 | 3070 | 3070 |
| NON-PIPELINE | PIPELINE | 512 | 2 | 1024 | 512 | 4 | 516 | 1540 | 1540 |
| PIPELINE | NON-PIPELINE | 512 | 2 | 514 | 512 | 4 | 2046 | 2560 | 2560 |
| PIPELINE | PIPELINE | 512 | 2 | 514 | 512 | 4 | 516 | 1030 | 1030 |

Fig. 14

52 : NON-FUNCTIONAL REQUIREMENT RESULT (PARALLEL TYPE, THIRD TIME)

| COMBINATION | | F1 | | | F2 | | PERFORMANCE | | |
|---|---|---|---|---|---|---|---|---|---|
| F1 | F2 | loop | LOGIC_LAT | Fcycle | loop | LOGIC_LAT | Fcycle | DT | Total Latecy |
| NON-PIPELINE | NON-PIPELINE | 512 | 2 | 1024 | 512 | 4 | 2046 | 2046 | 2046 |
| NON-PIPELINE | PIPELINE | 512 | 2 | 1024 | 512 | 4 | 516 | 1024 | 1024 |
| PIPELINE | NON-PIPELINE | 512 | 2 | 514 | 512 | 4 | 2046 | 2046 | 2046 |
| PIPELINE | PIPELINE | 512 | 2 | 514 | 512 | 4 | 516 | 512 | 512 |

HIGH LEVEL SYNTHESIS APPARATUS, HIGH LEVEL SYNTHESIS METHOD, AND COMPUTER READABLE MEDIUM

TECHNICAL FIELD

The present invention relates to a high level synthesis apparatus, a high level synthesis method, and a high level synthesis program that automatically generate a register transfer level circuit description from an operational description in a programming language.

BACKGROUND ART

In conventional design of a semiconductor integrated circuit, the operation of a combined circuit of registers (flip-flops) has been described in a hardware description language such as RTL (Register Transfer Level). Since the circuit scale of an integrated circuit has been increased in recent years, design using a hardware description language requires much design time. Accordingly, there is a proposed technique for making design using a high-level language such as the C language, the C++ language, the SystemC language, or the Matlab language, which has higher abstraction than a hardware description language and then automatically generating RTL. The tools for achieving this are commercially available as high level synthesis tools.

The designer can make circuit design by inputting a source code described in a high-level language and a circuit specification to a high-level synthesis tool. In addition, the designer inputs circuit specifications that cannot be represented by a high-level language or cannot be represented efficiently by a source code to a high level synthesis tool by setting high level synthesis options such as an option, attribute, and pragma.

These high level synthesis options have effects on the latency, the area, the throughput, the power consumption, the amount of memory use, the amount of multiplier use, and the like, which are the non-functional requirements of a circuit. A high level synthesis tool has high level synthesis options for specifying conversion of arrays to memories or registers or for specifying pipelined computation or non-pipelined computation. By setting these high level synthesis options without changing the operational description of a source code when high level synthesis is performed, the amount of memory use and throughput, which are non-functional requirements, can be obtained easily.

That is, a desired circuit can be obtained by trying to combine these high level synthesis options and selecting the optimum circuit that meets the characteristics (that is, non-functional requirements) obtained from the try results.

However, since there are enormous combinations of these high level synthesis options, the speed of a search needs to be enhanced. PTL 1 discloses the method for enhancing the speed of a search in the design space of the high level synthesis options by defining the design space.

CITATION LIST

Patent Literature

PTL 1: Japanese Patent No. 5605435

SUMMARY OF INVENTION

Technical Problem

However, the technique in PTL 1 has a problem in that individual clusters can be optimized, but a search for architecture between clusters is disabled because the architecture between clusters is not considered.

An object of the invention is to make architecture design in consideration of the structures of execution units in architecture design for meeting non-functional requirements and to perform high level synthesis for achieving the architecture.

Solution to Problem

A high level synthesis apparatus according to the present invention includes:

a structure determination unit to obtain an operational description and to determine a candidate of a circuit structure applicable to a plurality of execution units as a structure candidate, the operational description describing an operation of a circuit and including the plurality of execution units;

a decision unit to calculate, as a circuit characteristic, a characteristic of the circuit when the circuit structure of the plurality of execution units is the structure candidate and to output the structure candidate as a determined circuit structure when the circuit characteristic meets a threshold; and a high level synthesis unit to perform high level synthesis on the operational description so that the circuit structure of the plurality of execution units becomes the determined circuit structure.

Advantageous Effects of Invention

In the high level synthesis apparatus according to the invention, the structure determination unit obtains an operational description describing an operation of a circuit and including a plurality of execution units and determines, as structure candidates, candidates of circuit structures applicable to the plurality of execution units. Then, the decision unit calculates, as a circuit characteristic, the characteristic of the circuit when the circuit structures of the plurality of execution units are the structure candidates and outputs the structure candidates as the determined circuit structures when the circuit characteristic meets the threshold. In addition, the high level synthesis unit performs high level synthesis on the operational description so that the circuit structures of the plurality of execution units become the determined circuit structures. Accordingly, the high level synthesis apparatus according to the invention is capable of obtaining the circuit structure of the execution unit for which the circuit characteristic meets the threshold as the determined circuit structure and performing high level synthesis to achieve the determined circuit structure.

BRIEF DESCRIPTION OF DRAWINGS

FIG. 6 illustrates a calculation expression 31 for an intra-unit structure (intra-loop architecture) used in decision processing S113 according to embodiment 1.

FIG. 7 illustrates the calculation expression 31 for the latency of a circuit structure (inter-loop architecture) used in the decision processing S113 according to embodiment 1.

FIG. 8 illustrates the calculation expression 31 for the DT of the circuit structure (inter-loop architecture) used in the decision processing S113 according to embodiment 1.

FIG. 9 illustrates an example of a non-functional requirement result 52 (serial type, first time) calculated by the decision processing S113 according to embodiment 1.

FIG. 10 illustrates an example of the non-functional requirement result 52 (parallel type, first time) calculated by the decision processing S113 according to embodiment 1.

FIG. 11 illustrates an example of the non-functional requirement result 52 (serial type, second time) calculated by the decision processing S113 according to embodiment 1.

FIG. 12 illustrates an example of the non-functional requirement result 52 (parallel type, second time) calculated by the decision processing S113 according to embodiment 1.

FIG. 13 illustrates an example of the non-functional requirement result 52 (serial type, third time) calculated by the decision processing S113 according to embodiment 1.

FIG. 14 illustrates an example of the non-functional requirement result 52 (parallel type, third time) calculated by the decision processing S113 according to embodiment 1.

DESCRIPTION OF EMBODIMENTS

Embodiment 1

*Description of the Structure*

Figure 1:
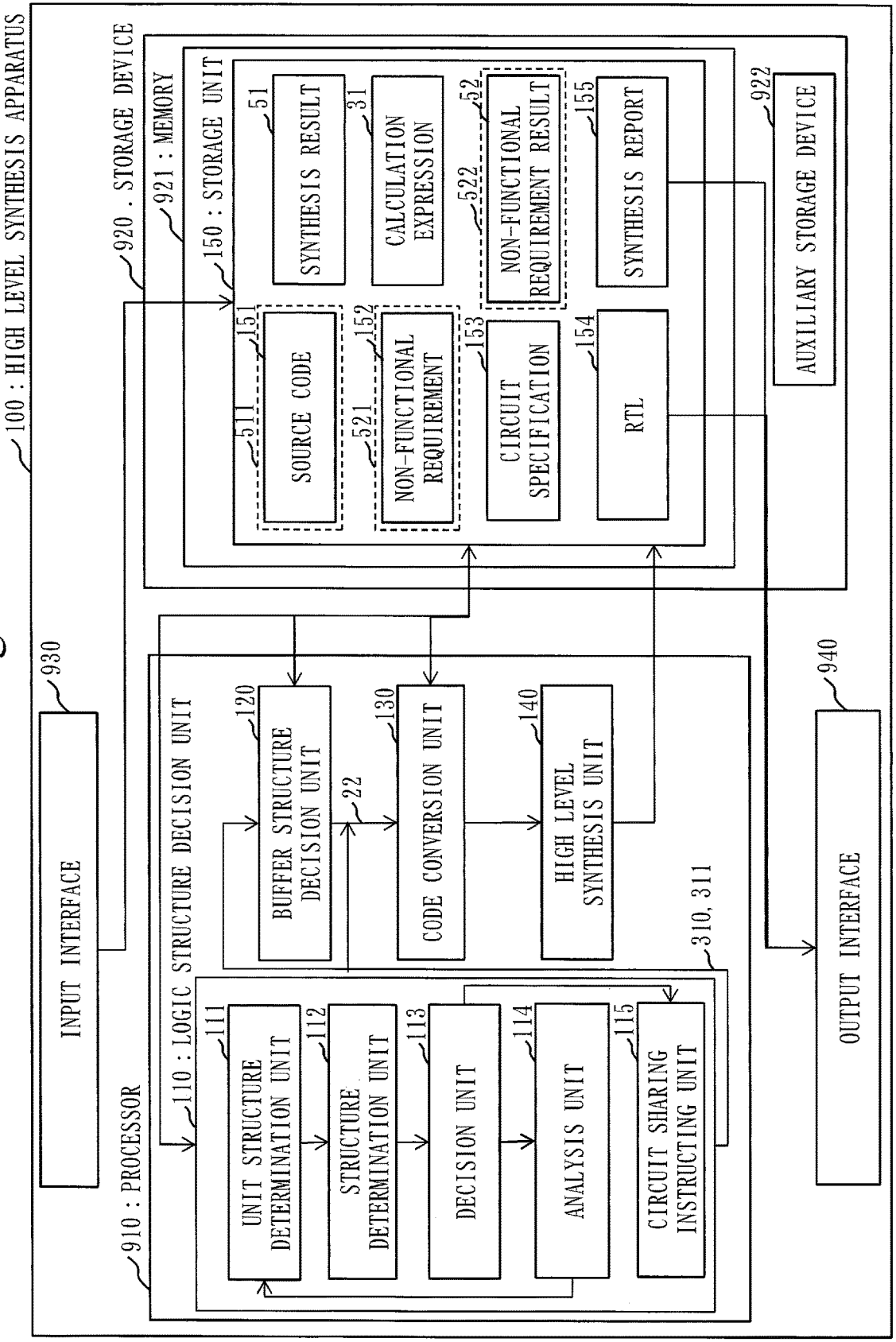
FIG. 1 is a structural diagram illustrating a high level synthesis apparatus 100 according to embodiment 1.

The structure of a high level synthesis apparatus 100 according to the embodiment will be described with reference to FIG. 1.

In the embodiment, the high level synthesis apparatus 100 is a computer. The high level synthesis apparatus 100 includes hardware such as a processor 910, a storage device 920, an input interface 930, and an output interface 940. The storage device 920 includes a memory 921 and an auxiliary storage device 922.

The high level synthesis apparatus 100 includes a logic structure decision unit 110, a buffer structure decision unit 120, a code conversion unit 130, a high level synthesis unit 140, and a storage unit 150 as a functional structure. The logic structure decision unit 110 includes a unit structure determination unit 111, a structure determination unit 112, a decision unit 113, an analysis unit 114, and a circuit sharing instructing unit 115.

In the following description, the functions of the logic structure decision unit 110, the buffer structure decision unit 120, the code conversion unit 130, and the high level synthesis unit 140 in the high level synthesis apparatus 100 are referred to as the functions of the "units" of the high level synthesis apparatus 100. The function of the logic structure decision unit 110 includes the functions of the unit structure determination unit 111, the structure determination unit 112, the decision unit 113, the analysis unit 114, and the circuit sharing instructing unit 115.

The functions of the "units" of the high level synthesis apparatus 100 are achieved by software.

Also, the storage unit 150 is achieved by the storage device 920. The storage unit 150 stores a source code 151, a non-functional requirement 152, a circuit specification 153, an RTL 154, and a synthesis report 155. In addition, the storage unit 150 stores information such as a synthesis result 51 generated by the unit structure determination unit 111 and a non-functional requirement result 52 calculated by the decision unit 113.

The processor 910 is connected to other hardware via signal lines and controls the other hardware.

The processor 910 is an IC (Integrated Circuit) for processing. Specifically, the processor 910 is a CPU (Central Processing Unit).

The storage device 920 includes the memory 921 and the auxiliary storage device 922. Specifically, the auxiliary storage device 922 is a ROM (Read Only Memory), a flash memory, or a HDD (Hard Disk Drive). Specifically, the memory 921 is a RAM (Random Access Memory). In the embodiment, the storage unit 150 is achieved by the memory 921. It should be noted that the storage unit 150 may be achieved by the auxiliary storage device 922 or may be achieved by the memory 921 and the auxiliary storage device 922. The storage unit 150 may be achieved by any method.

The input interface 930 is a port connected to input devices such as a mouse, a keyboard, and a touch panel. Specifically, the input interface 930 is a USB terminal. It should be noted that the input interface 930 may be a port connected to a LAN (Local Area Network).

The output interface 940 is a port to which a cable of display equipment such as a display device is connected. Specifically, the output interface 940 is a USB terminal or an HDMI (registered trademark) (High Definition Multimedia Interface) terminal. Specifically, the display device is an LCD (Liquid Crystal Display). It should be noted that the output interface 940 may be connected to an output device such as a printer device.

The auxiliary storage device 922 stores programs that achieve the functions of the "units". The programs are loaded to the memory 921, read by the processor 910, and executed by the processor 910. The auxiliary storage device 922 also stores an OS (Operating System). At least part of the OS is loaded to the memory 921 and the processor 910 executes the programs that achieve the functions of the "units" while executing the OS.

The high level synthesis apparatus 100 may have only one processor 910 or may have a plurality of processors 910. The plurality of the processors 910 may execute the programs that achieve the functions of the "units" in cooperation.

The information, data, signal values, and variables representing the results of processing by the functions of the "units" are stored in the memory 921, the auxiliary storage device 922, or the register or cache memory in the processor 910. It should be noted that arrows connecting individual units to the storage unit 150 in FIG. 1 represent the storing of the results of processing in the storage unit 150 by individual units or reading of information from the storage unit 150 by individual units. In addition, arrows connecting individual units represent flows of control.

The programs that achieve the functions of the "units" may be stored in a portable recording medium such as a magnetic disc, a flexible disc, an optical disc, a compact disc, a Blu-ray (registered trademark) disc, or a DVD (Digital Versatile Disc).

It should be noted that the programs that achieve the functions of the "units" are also referred to as high level synthesis programs 520. The high level synthesis programs 520 are programs that achieve the functions described as the "units". In addition, high level synthesis program products represent a storage medium and a storage device in which the high level synthesis programs 520 are stored and computer-readable programs are loaded regardless of the appearance thereof.

<Input and Output of High Level Synthesis Apparatus 100>

Next, the input and output of the high level synthesis apparatus 100 will be described.

The high level synthesis apparatus 100 performs high level synthesis by receiving the source code 151, the non-functional requirement 152, and the circuit specification 153 and outputs the RTL 154 and the synthesis report 155.

The source code 151 is an operational description in which the operation of a circuit subjected to high level synthesis is described in a high-level language such as the C language, the C++ language, the SystemC language, or the Matlab language. The source code 151 is input from an input device via the input interface 930 and stored in the storage unit 150. The source code 151 is an example of an operational description 511 that describes the operation of a circuit.

In addition, the source code 151 includes a plurality of execution units 515. The execution units 515 are also referred to as, for example, loop descriptions, functions, operation units, or submodules.

The non-functional requirement 152 defines the non-functional requirement of a requested circuit. Specifically, the non-functional requirement 152 defines information such as the latency, the area, the throughput, the power consumption, the amount of memory use, the amount of multiplier use of a requested circuit, and the filling period of input data to a circuit. The non-functional requirement 152 is input from an input device via the input interface 930 and then stored in the storage unit 150. The non-functional requirement of a circuit is an example of circuit characteristics representing the characteristics or performance of a circuit. In addition, the non-functional requirement 152 is an example of a threshold 521 of a circuit characteristic.

The circuit specification 153 defines the specification of a circuit. Specifically, the circuit specification 153 defines information such as the definition of an interface with the outside, the name (type name of an FPGA or process name of an ASIC or the like) of a device to be mapped, and frequency. The circuit specification 153 is input from an input device via the input interface 930 and then stored in the storage unit 150.

The RTL 154 is an example of a hardware description language, that is, HDL. The synthesis report 155 is output from the high level synthesis tool together with the RTL 154. The non-functional requirement of the generated RTL 154 is set in the synthesis report 155. That is, information such as the latency, the area, the throughput, the power consumption, the amount of memory use, the amount of multiplier use of the generated RTL, and the filling period of input data to the circuit are set in the synthesis report 155.

<About the Filling Period of Input Data>

The filling period of input data to a circuit will be described. A general item of the characteristics (performance) of a circuit is latency. The latency is generally defined as the period (or the number of cycles) from when input data is input to a circuit until the input data is output.

Two major circuit structures can be considered to design a circuit that executes a function F1 and a function F2.

In the first circuit structure, F1 and F2 are orderly executed in sequence. In this structure, F1 is first processed and then F2 is processed. Since circuit sharing is enabled between F1 and F2 in this circuit, reduction in the circuit scale can be expected. That is, F1 does not operate while F2 operates and F2 does not operate while F1 operates. When the latency of F1 is assumed to be F1_LAT and the latency of F2 is assumed to be F2_LAT, the total latency is the sum of F1_LAT and F2_LAT, that is, F1_LAT+F2_LAT.

In the second circuit structure, F1 and F2 operate in parallel. A buffer A and a buffer B (two memories) are prepared between F1 and F2 as the double buffer structure. F1 writes the processing result to the buffer A and, at the same time, F2 reads data from the buffer B and processes the read data in a bucket brigade manner. The latency in this circuit structure is also F1_LAT+F2_LAT, which is the same as in the first circuit structure.

However, the period during which the next data can be received is different between the above two circuit structures. In the first circuit structure, the next data cannot be received until F2 is executed after F1 receives data. In contrast, since the second circuit structure is the bucket brigade one, F1 can receive the next data regardless of whether F2 is being executed.

Here, the input data filling period is defined. The input data filling period is the period for which data input to an array used by any function is performed. This input data filling period is referred to as the DT. This DT is one of the non-functional requirements 152.

The DT in the first circuit structure above is F1_LAT+F2_LAT. The DT in the second circuit structure above is max(F1_LAT, F2_LAT).

By defining the DT in the non-functional requirement 152, the candidate of a circuit to be generated can be limited, thereby enabling a high-speed search.

*Description of Operation*

Next, the operation of the high level synthesis apparatus 100 according to the embodiment will be described.

Figure 2:
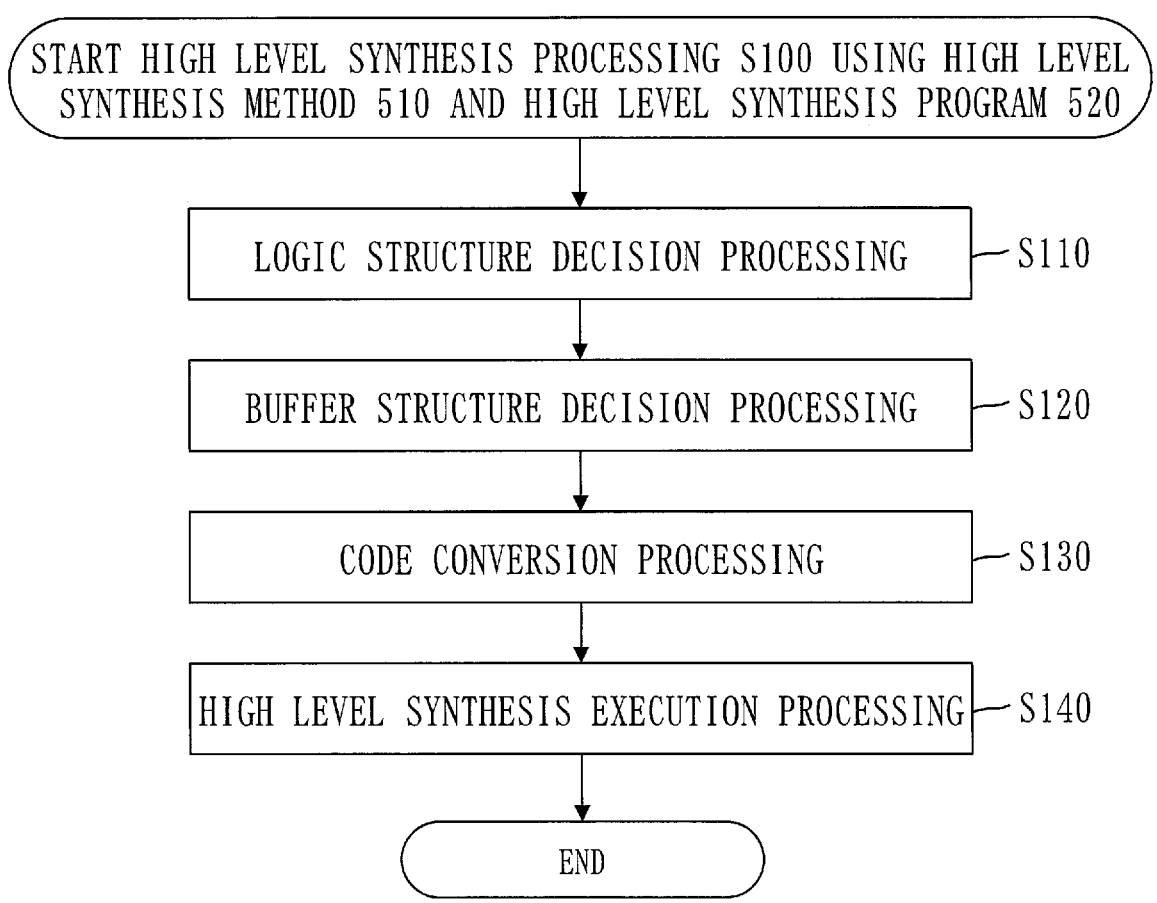
FIG. 2 is a flowchart illustrating high level synthesis processing S100 by a high level synthesis method 510 and a high level synthesis program 520 of the high level synthesis apparatus 100 according to embodiment 1.

High level synthesis processing S100 by a high level synthesis method 510 and the high level synthesis program 520 of the high level synthesis apparatus 100 according to the embodiment will be schematically described with reference to FIG. 2.

The high level synthesis processing S100 includes logic structure decision processing S110, buffer structure decision processing S120, code conversion processing S130, and high level synthesis execution processing S140.

The high level synthesis processing S100 inputs the source code 151, the non-functional requirement 152 including the input data filling period, and the circuit specification 153.

The logic structure decision processing S110 determines the circuit structure of an entire circuit that meets the non-functional requirement 152 as a determined circuit structure 310 and determines the intra-unit structure of a submodule (execution unit) constituting a circuit that meets the non-functional requirement 152 as a determined intra-unit structure 311.

In addition, the buffer structure decision processing S120 determines the buffer structure to which each execution unit is connected. Determination of the circuit structure of a circuit that meets the non-functional requirement 152, the intra-unit structure of the execution units constituting the circuit, and the buffer structure to which each execution unit is connected is also referred to as a search for the circuit structure.

<Logic Structure Decision Processing S110>

Figure 3:
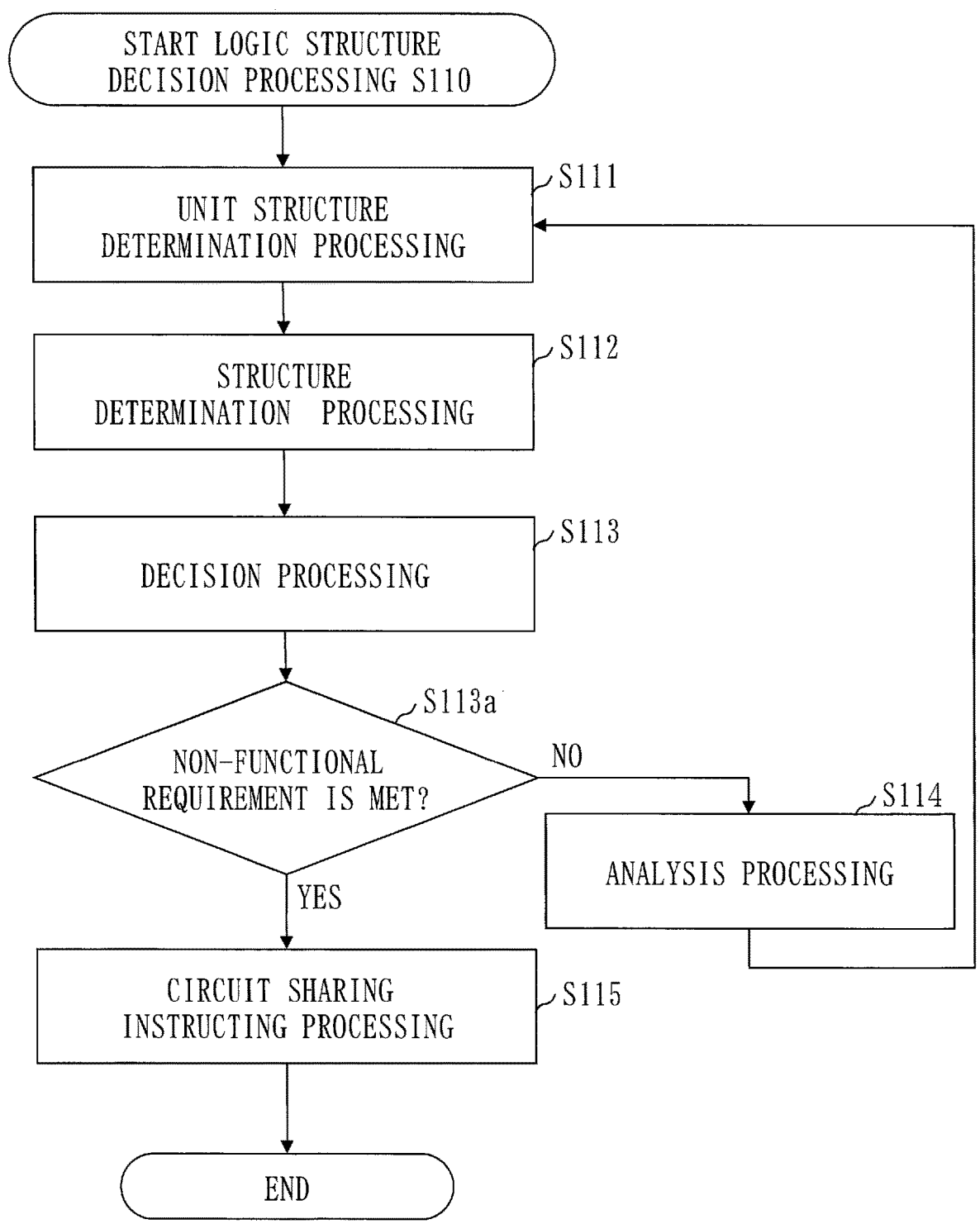
FIG. 3 is a flowchart illustrating logic structure decision processing S110 according to embodiment 1.

FIG. 3 is a flowchart illustrating the logic structure decision processing S110 according to the embodiment.

The logic structure decision processing S110 includes unit structure determination processing S111, structure determination processing S112, decision processing S113, analysis processing S114, and circuit sharing instructing processing S115.

<Unit Structure Determination Processing S111>

First, the unit structure determination processing S111 will be described. In the unit structure determination processing S111, the unit structure determination unit 111 determines candidates of the intra-unit structure applicable to each of the plurality of execution units as intra-unit structure candidates.

In the unit structure determination processing S111, the unit structure determination unit 111 extracts the loop description points from the source code 151 as execution units via syntactic analysis and performs functionalization for each loop. A loop is an example of an execution unit.

Then, the unit structure determination unit 111 decides whether dependency is present between iterations in each loop. When deciding that no dependency is present between iterations in each loop, the unit structure determination unit 111 decides that each loop can be pipelined or developed. That each loop can be developed means that each loop can be parallelized. A decision as to whether dependency is present between iterations in each loop may be made by the high level synthesis tool. In addition, a description range including a function or the like other than a loop may be functionalized as a cluster.

When deciding that dependency is present between iterations in each loop, the unit structure determination unit 111 decides that each loop cannot be pipelined or developed.

The unit structure determination processing S111 can decide whether each loop can be pipelined and whether each loop can be developed. Accordingly, the speed of search processing can be enhanced by excluding the loops (circuits) that cannot be pipelined or developed from a search for a desired circuit.

Next, the unit structure determination unit 111 inputs the source code 151 to the high level synthesis tool and obtains the non-functional requirements such as the circuit scale and the latency for each loop as the synthesis result 51. Specifically, the unit structure determination unit 111 obtains the circuit scale (AREA) and the latency (LOGIC_LAT) for one iteration process in the loop for the pipelined case and the non-pipelined case.

At this time, the unit structure determination unit 111 selects a mode in which circuit sharing is not performed in the high level synthesis tool. When circuit sharing is performed, the latency is apt to increase generally. Although the latency of a circuit can be set by an option of the high level synthesis tool, the latency can be set infinitely. In the embodiment, by suppressing circuit sharing at the time of the unit structure determination processing S111 and specifying the latency in the circuit sharing instructing processing S115, which is a post-process, to perform circuit sharing, the optimum solution can be obtained at high speed by restricting the search range.

Figures 4, 5:
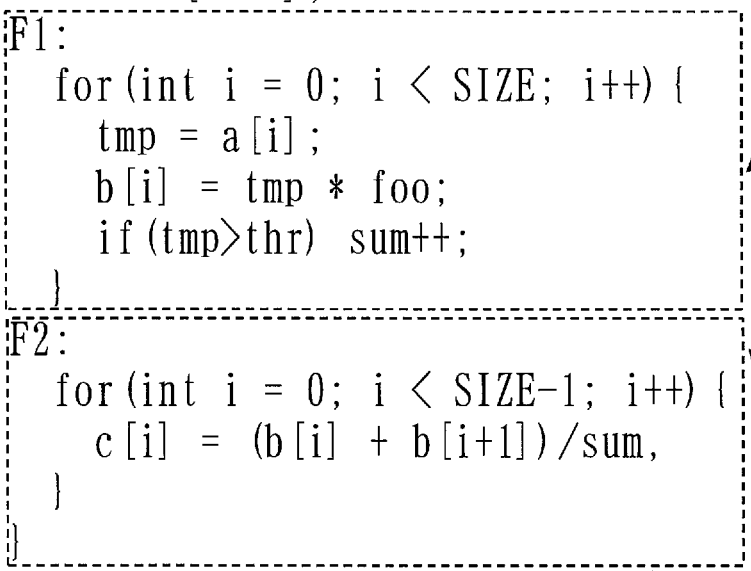
FIG. 4 illustrates an example of a source code 151 according to embodiment 1.
FIG. 5 illustrates an example of a synthesis result 51 when the source code 151 according to embodiment 1 is input to a high level synthesis tool.

FIG. 4 illustrates an example of the source code 151 according to the embodiment.

The unit structure determination unit 111 extracts the loop description points from the source code 151 illustrated in FIG. 4 and functionalizes F1 and F2 for each loop. Each of the loop description of F1 and the loop description of F2 illustrated in FIG. 4 is an example of the execution unit 515.

Since no dependency is present in each loop in the source code 151 illustrated in FIG. 4, the unit structure determination unit 111 decides that no dependency is present in each loop and decides that any loop can be pipelined or developed.

Then, the unit structure determination unit 111 inputs the source code 151 to the high level synthesis tool.

FIG. 5 illustrates the synthesis result 51 when the source code 151 according to the embodiment is input to the high level synthesis tool. Although FIG. 5 illustrates the synthesis result 51 when high level synthesis is performed using the pipelined loop (circuit), the synthesis result 51 can also be obtained in the same way when high level synthesis is performed using a non-pipelined loop.

The unit structure determination processing S111 is also referred to as intra-loop architecture decision processing that treats the loops included in the entire circuit represented by the source code 151 as the execution unit or the function and decides the structure of the inside of the loops. In addition, the unit structure determination unit 111 is also referred to as an intra-loop architecture decision unit.

As described above, the unit structure determination unit 111 decides whether each execution unit can be pipelined and whether each execution unit can be developed and determines the candidates of the intra-unit structure applicable to each execution unit as intra-unit structure candidates. That is, when the unit structure determination unit 111 decides that the execution unit can be pipelined, the intra-unit structure candidates are pipelined and non-pipelined.

<Structure Determination Processing S112>

Next, the structure determination processing S112 will be described.

In the structure determination processing S112, the structure determination unit 112 obtains the source code 151 describing the operation of a circuit and including a plurality of execution units and determines the candidate of the circuit structure applicable to the plurality of execution units as the structure candidate.

Specifically, the structure determination unit 112 determines the structure candidate based on the dependency of different loop descriptions. That is, the structure determination unit 112 decides whether the circuits of different loop description parts can be executed in parallel based on the dependency of different loop descriptions. When deciding that the circuits of different loop description parts can be executed in parallel, the structure determination unit 112 measures the timing at which the parallel execution of the circuits of different loop description parts can be started.

The dependency of different loop descriptions means the structures (that is, the circuit structure of the entire circuit) of execution units represented by loops in circuits described by the source code 151.

There are three inter-loop architecture types (that is, circuit structures).

The first one is a serial type. The serial type has the circuit structure in which parallel execution is not performed, and the next loop processing is performed after the previous loop processing is completed. The second one is a parallel type (basic form). The second architecture type has the circuit structure in which the previous loop processing and the next loop processing are executed completely independently from each other in parallel. The second architecture type is the bucket brigade type described above. The third one is a parallel type (delay form). The third architecture type has the circuit structure in which execution of the next loop is started during execution of the previous loop.

The feature of the serial type is that the latency is large, but the promotion of circuit sharing can be performed. The latency of the parallel type (basic form) is moderate. In addition, the feature of the parallel type (delay form) is that the latency can be reduced.

Of the three circuit structures, the serial type and the parallel type (basic form) can be adopted in any loop description. However, the parallel type (delay form) depends on the implementation of the source code.

In the structure determination processing S112, the structure determination unit 112 determines whether the circuits of different loop description parts can be configured by the parallel type (delay form).

The procedure of the structure determination processing S112 will be described below.

(1) The structure determination unit 112 extracts the variables that are used in common (that is, used for reference or substitution in common) between loops via syntactic analysis.

(2) The structure determination unit 112 extracts the indexes for writing to or reading from the variables in each loop via syntactic analysis. When a variable is not an array in writing to the variable, the index is set to the last iteration value (that is, the loop upper limit value). In addition, when a variable is not an array in reading from the variable, the index is set to 0.

(3) The structure determination unit 112 calculates the absolute value of the difference between the index for writing to and the index for reading from a common variable and calculates the maximum value of these values as Delay.

Specific description will be given with reference to the source code 151 in FIG. 4. In the structure determination processing S112, the case in which the structure determination unit 112 receives the source code 151 in FIG. 4 will be described.

(1) The structure determination unit 112 extracts a variable sum and a variable b used in common across loops via syntactic analysis.

(2) The indexes assigned to sum and b[i] in the loop of F1 are extracted. The index assigned to sum is SIZE−1 (loop upper limit value). The index assigned to b[i] is "0 . . . SIZE−1 (+1)". The symbol " . . . " represents the value enclosed by parentheses is incremented in sequence. That is, "0 . . . SIZE−1 (+1)" is equivalent to "0, 1, 2, 3 . . . SIZE−1".

In the loop of F2, sum and b[i] are read. Reading is performed from sum, b[i], and b[i+1], and the indexes thereof are 0, "0 . . . SIZE−1 (+1)", and "1 . . . SIZE−2 (+1)".

(3) Next, Delay is calculated.

In the example, |(SIZE− 1)−(0)|=SIZE− 1 is used for sum. |(0 . . . SIZE− 1)−(0 . . . SIZE−1)|=0 . . . 0(0) is used for b[i]. |(0 . . . SIZE− 1)−(1 . . . SIZE− 2)|=1 . . . 1 (0) is used for b[i+1]. Accordingly, of sum, b[i], and b[i+1], the maximum value of the absolute value of the difference between the indexes is SIZE− 1.

When a parallel number N is specified in the analysis processing S114 described later, loops are developed and calculation is performed similarly.

As described above, the structure determination unit 112 decides the dependency of a plurality of loop descriptions based on the indexes of the variables common to a plurality of loop descriptions.

The structure determination processing S112 determines whether the circuits of different loop description parts included in the entire circuit represented by the source code 151 can be configured as the parallel type (delay form). The structure determination processing S112 is also referred to as inter-loop architecture decision processing. In addition, the structure determination unit 112 is also referred to as an inter-loop architecture decision unit.

As described above, the structure determination unit 112 decides whether the circuit structure of a plurality of loop descriptions can be configured as the parallel type (delay form) and determines the structure candidate of the circuit structure of the plurality of loop descriptions.

<Decision Processing S113>

In the decision processing S113, the decision unit 113 calculates the characteristic of the circuit as a circuit characteristic 522 when the circuit structure of the plurality of loop descriptions is the structure candidate determined in the structure determination processing S112. Then, the decision unit 113 outputs the structure candidate as the determined circuit structure 310 when the circuit characteristic 522 meets the threshold 521. In addition, when the circuit characteristic 522 meets the threshold 521, the decision unit 113 outputs the intra-unit structure candidate of each of the plurality of the execution units 515 as the determined intra-unit structure 311.

Specifically, the decision unit 113 calculates the non-function (circuit characteristic 522) of the circuit structure (inter-loop architecture) of the entire circuit. At this time, the decision unit 113 calculates the circuit characteristic 522 for each of the circuit structure candidates of the execution units and for each of the intra-unit structure candidates of the each execution unit and calculates the non-functional requirement result 52 including the circuit characteristic 522.

The decision unit 113 calculates the circuit characteristic 522 including the latency of the circuit and the input data filling period (DT).

The decision unit 113 decides whether the calculated non-functional requirement result 52 meets the non-functional requirement 152 (threshold 521) stored in the storage unit 150 (step S113a).

FIG. 6 illustrates an execution unit calculation expression 3131, which is a calculation expression 31 of the intra-unit structure (intra-loop architecture) used in the decision processing S113 according to the embodiment.

In addition, FIG. 7 illustrates a circuit structure calculation expression 3132, which is the calculation expression 31 of the circuit structure (inter-loop architecture) used in the decision processing S113 according to the embodiment. FIG. 8 illustrates a DT calculation expression 3133, which is the calculation expression 31 of the circuit structure (inter-loop architecture) used in the decision processing S113 according to the embodiment.

In the drawings, LOOP represents the number of loops. N represents the number of parallelizations. LOGIC_LAT represents the latency for one iteration. FN represents the processing of loop number N and includes F1 and F2 in the sample (specific example). $FN_{cycle}$ represents the latency of FN. $Delay_{n-1, n}$ represents the distance obtained in the FN-th structure determination processing S112 and the (FN−1)-th structure determination processing S112. The DII (Data Initiation Interval) represents the throughput when calculation is pipelined and this is defined similarly also in the high level synthesis tool.

The decision unit 113 calculates the latency of an execution unit, that is, the latency within a loop using the execution unit calculation expression 3131. Then, the decision unit 113 calculates the latency of the circuit structure (inter-loop architecture) of the entire circuit using the latency of the execution unit and the circuit structure calculation expression 3132. In addition, the decision unit 113 calculates the DT of the circuit structure (inter-loop architecture) of the entire circuit using the latency of the execution unit and the DT calculation expression 3133.

That is, the decision unit 113 calculates the latency and the DT as the non-functional requirement result 52 as the non-function of the circuit structure (inter-loop architecture) of the entire circuit.

FIG. 9 and FIG. 10 illustrate the non-functional requirement result 52 calculated from the source code 151 illustrated in FIG. 4. FIG. 9 illustrates the non-functional requirement result 52 when the circuit structure of the source code 151 is of serial type. In addition, FIG. 10 illustrates the non-functional requirement result 52 when the circuit structure of the source code 151 is of parallel type.

As illustrated in FIG. 9 and FIG. 10, the decision unit 113 calculates the characteristic of each of the plurality of execution units as the each-unit characteristic and calculates the circuit characteristic 522 of the entire circuit based on the calculated each-unit characteristic. In addition, as illustrated in FIG. 9 and FIG. 10, the decision unit 113 calculates the circuit characteristic 522 for each intra-unit structure candidate of each of the plurality of execution units. That is, the decision unit 113 calculates the each-unit characteristic for each intra-unit structure candidate in the case of a pipeline and the case of a non-pipeline for F1 and F2. Then, the decision unit 113 calculates the circuit characteristic 522 based on the calculated each-unit characteristic for each intra-unit structure candidate.

In step S113a in FIG. 3, the decision unit 113 decides whether the circuit characteristic 522 meets the threshold 521. Specifically, the decision unit 113 decides whether the non-functional requirement result 52 calculated from the source code 151 meets the non-functional requirement 152.

When the decision unit 113 decides that the non-functional requirement result 52 does not meet the non-functional requirement 152, the processing proceeds to the analysis processing S114. In contrast, when the decision unit 113 decides that the non-functional requirement result 52 meets the non-functional requirement 152, the processing proceeds to the circuit sharing instructing processing S115.

<Analysis Processing S114>

When the decision unit 113 decides that the circuit characteristic 522 does not meet the threshold 521, the analysis unit 114 analyzes the execution unit 515 for which the structure is changed based on the each-unit characteristic in the analysis processing S114. Specifically, when the non-functional requirement result 52 does not meet the non-functional requirement 152, the analysis unit 114 analyzes the points to be improved to meet the non-functional requirement 152. The analysis unit 114 outputs an instruction for improvement to the unit structure determination processing S111 as an improvement instruction and the processing returns to the unit structure determination processing S111.

Specifically, when the number of cycles that represents the latency does not meet the non-functional requirement 152, the analysis unit 114 extracts the execution unit having the maximum estimated latency value among the execution units. Then, the analysis unit 114 sets the parallelism degree N of the extracted execution unit to 2 or outputs an improvement instruction of, for example, frequency change to the unit structure determination unit 111. In the unit structure determination processing S111, the unit structure determination unit 111 improves the design based on the improvement instruction output from the analysis unit 114 and makes evaluation again.

In addition, when the circuit scale as the non-functional requirement 152 is not met, the analysis unit 114 outputs, to the unit structure determination unit 111, an improvement instruction that defines the value obtained by adding 1 to the current LOGIC_LAT value as LOGIC_LAT. In the unit structure determination processing S111, the unit structure determination unit 111 turns on the circuit sharing mode in the high level synthesis tool based on the improvement instruction output from the analysis unit 114 and performs high level synthesis. In the pervious unit structure determination processing S111, high level synthesis is performed with the circuit sharing mode turned off. That is, the latency is smallest and the circuit scale is large. Although the circuit sharing mode is turned on when the circuit scale as the non-functional requirement 152 is not met, the high level synthesis tool cannot know the degree of circuit sharing to be performed in this case. This is because the latency is not set. By setting the latency, circuit sharing can be performed under a limited time constraint. That is, this processing makes a search for circuit sharing while maintaining the latency, which is the non-functional requirement, as much as possible, thereby enabling a high speed search for circuit scale sharing.

Since the analysis processing S114 can decide the points having large improvement effects to increase the speed of a search for the circuit that meets the target non-functional requirement 152 and can output an improvement instruction as described above, an efficient search can be performed.

The following description references the source code 151 in FIG. 4. It is assumed that the latency of the non-functional requirement 152 is 1000 and the DT is 1000. In the non-functional requirement results 52 illustrated in FIG. 9 (serial type) and FIG. 10 (parallel type), the latency and the DT, which are the non-functional requirements 152, are not met.

The analysis unit 114 decides that the non-functional requirement result 52 does not meet the non-functional requirement 152.

The analysis unit 114 performs parallelization to reduce large Fcycle values based on the non-functional requirement results 52 in FIG. 9 and FIG. 10. The execution unit (that is, the function or logic) to be parallelized is F2 having a large latency. Whether the latency is large or small is decided based on, for example, the total latency and the like. Although the latency of F1 is larger when F1 is non-pipelined and F2 is pipelined in this example, F2 is parallelized for simplicity. The analysis unit 114 determines appropriate improvement points by combining individual execution units.

The analysis unit 114 generates an improvement instruction that specifies the parallelization N of F2 as 2 and outputs the improvement instruction to the unit structure determination unit 111. In the unit structure determination processing S111, the unit structure determination unit 111 outputs the improvement instruction that specifies the parallelization N of F2 as 2 to the unit structure determination processing S111 based on the improvement instruction output from the analysis unit 114 and makes evaluation again.

FIG. 11 (serial type) and FIG. 12 (parallel type) illustrate the non-functional requirement results 52 calculated again in the unit structure determination processing S111. Even the non-functional requirement results 52 in FIG. 11 (serial type) and FIG. 12 (parallel type) do not meet the non-functional requirement 152. Accordingly, the analysis unit 114 outputs an improvement instruction that specifies the parallelization N of F1 as 2 to the unit structure determination processing S111 and makes evaluation again. FIG. 13 (serial type) and FIG. 14 (parallel type) illustrate the non-functional requirement results 52 calculated again in the unit structure determination processing S111. Based on the result in FIG. 14, it is determined that the circuit structure in which F1 pipelined and having a parallelization of 2 and F2 pipelined and having a parallelization of 2 meets the non-functional requirement 152.

<Circuit Sharing Instructing Processing S115>

Next, description is continued by returning to FIG. 3.

When the decision unit 113 decides that the circuit characteristic 522 meets the threshold 521, the circuit sharing instructing unit 115 instructs circuit sharing based on the each-unit characteristic of each execution unit. Specifically, the circuit sharing instructing unit 115 obtains the latency of intra-unit structure that does not affect the latency of the entire circuit and provides the obtained latency as an option for the high level synthesis tool.

This processing is limited to the case in which the parallel type is selected as the circuit structure. In the parallel type, there is an execution unit whose latency does not appear in the latency calculation expression and the DT calculation expression as in the calculation expression described above. For example, since calculation is performed with Max in the DT calculation expression of parallel type, even if the latency of an execution unit having a value smaller than this maximum value is set to a value equal to or less than the maximum value, the performance of the entire circuit is not affected.

Accordingly, the latency of the applicable intra-unit structure is increased to the maximum value. This enables the circuit sharing of the execution unit and enables effective and optimum circuit sharing because the latency of the entire circuit is not affected only in this case (generally, the latency is increased due to circuit sharing).

In step S113a of the decision processing S113 illustrated as an example in FIG. 4, the circuit structure decided to have met the non-functional requirement 152 is the circuit structure in which F1 pipelined and having a parallelization of 2 and F2 pipelined and having a parallelization of 2 are executed in parallel. As is clear in FIG. 14, this circuit structure is of parallel type, and LOGIC_LAT of F1 is 2 and LOGIC_LAT of F2 is 4. Since the performance of the entire circuit is not affected even if LOGIC_LAT of F1 is set to 4, LOGIC_LAT is set to 4 and F1 is synthesized again. This enables circuit sharing and reduces the area.

The circuit structure that meets the non-functional requirement 152 is determined by the logic structure decision processing S110 as described above.

<Buffer Structure Decision Processing S120>

Next, the buffer structure decision unit 120 determines buffer structures 22 between a plurality of execution units when the plurality of execution units constitute the determined circuit structure 310. That is, the buffer structure decision unit 120 determines the buffer structures 22 that achieve the determined circuit structure 310 determined in the logic structure decision processing S110.

The procedure of the buffer structure decision processing S120 will be described below.

(1) Determination of the Basic Structure

The buffer structure decision unit 120 determines the basic structure of a buffer as Share type when the circuit structure (inter-loop architecture) of the entire circuit is of serial type, double buffer type when the circuit structure is of parallel type (basic form), or line buffer type when the circuit structure is of parallel type (delay form).

(2) Obtainment of SIZE (2-1) For Share type: A decision is made based on the number of elements of an array or the like.

(2-2) For double buffer type: A decision is made based on the number of elements of an array or the like.

(2-3) For line buffer type: The delay amount (Delay) is used.

(3) Conversion to Shift Register

When a plurality of read operations (references) is present for an array in the case of Share type, double buffer type, and line buffer type, conversion to a shift register is considered based on the index of the number of elements.

(4) Decision of the Number of Ports and the Number of Memories

When the intra-unit structure is parallel, the buffer structure decision unit 120 generates the number of ports and the number of memories that correspond to the number of parallelizations.

The buffer structure decision unit 120 determines the buffer structure 22 in the procedure described above.

<Code Conversion Processing S130 and High Level Synthesis Execution Processing S140>

In the code conversion processing S130, the code conversion unit 130 converts an operational description so that the circuit structure of a plurality of execution units becomes the determined circuit structure 310 and outputs the converted operational description as the converted description. In addition, the code conversion unit 130 converts the operational description so that the intra-unit structure of each of the plurality of execution units becomes the determined intra-unit structure 311 and sets high level synthesis options. In addition, the code conversion unit 130 converts the operational description so as to achieve the buffer structure 22 determined by the buffer structure decision unit 120 and sets high level synthesis options.

Specifically, the code conversion unit 130 obtains the determined circuit structure 310 and the determined intra-unit structure 311 determined in the logic structure decision processing S110 and the buffer structure 22 determined in the buffer structure decision processing S120.

The code conversion unit 130 converts and inserts a source code and sets high level synthesis options to achieve the determined circuit structure 310, the determined intra-unit structure 311, and the buffer structure based on the determined circuit structure 310, the determined intra-unit structure 311, and the buffer structure. Since the description method and options depend on the high level synthesis tool, a template design may be used to generate a source code and high level synthesis options.

In the high level synthesis execution processing S140, the high level synthesis unit 140 executes the high level synthesis execution processing S140 by inputting the source code and the high level synthesis options generated in the code conversion processing S130 to the high level synthesis tool and outputs the RTL 154 and the synthesis report 155.

Now, the description of the high level synthesis processing S100 by the high level synthesis apparatus 100 according to the embodiment is completed.

*Other Structures*

The high level synthesis apparatus 100 may have a communication device and may receive the source code 151, the non-functional requirement 152, and the circuit specification 153 through the communication device. In addition, the high level synthesis apparatus 100 may transmit the RTL 154 and the synthesis report 155 through the communication device. In this case, the communication device has a receiver and a transmitter. Specifically, the communication device is a communication chip or a NIC (Network Interface Card). The communication device functions as a communication unit through which data is communicated. The receiver functions as a receiving unit that receives data and the transmitter functions as a transmitting unit that transmits data.

In addition, although the functions of the "units" of the high level synthesis apparatus 100 are achieved by software in the embodiment, the functions of the "units" of the high level synthesis apparatus 100 may be achieved by hardware as a modification.

Figure 15:
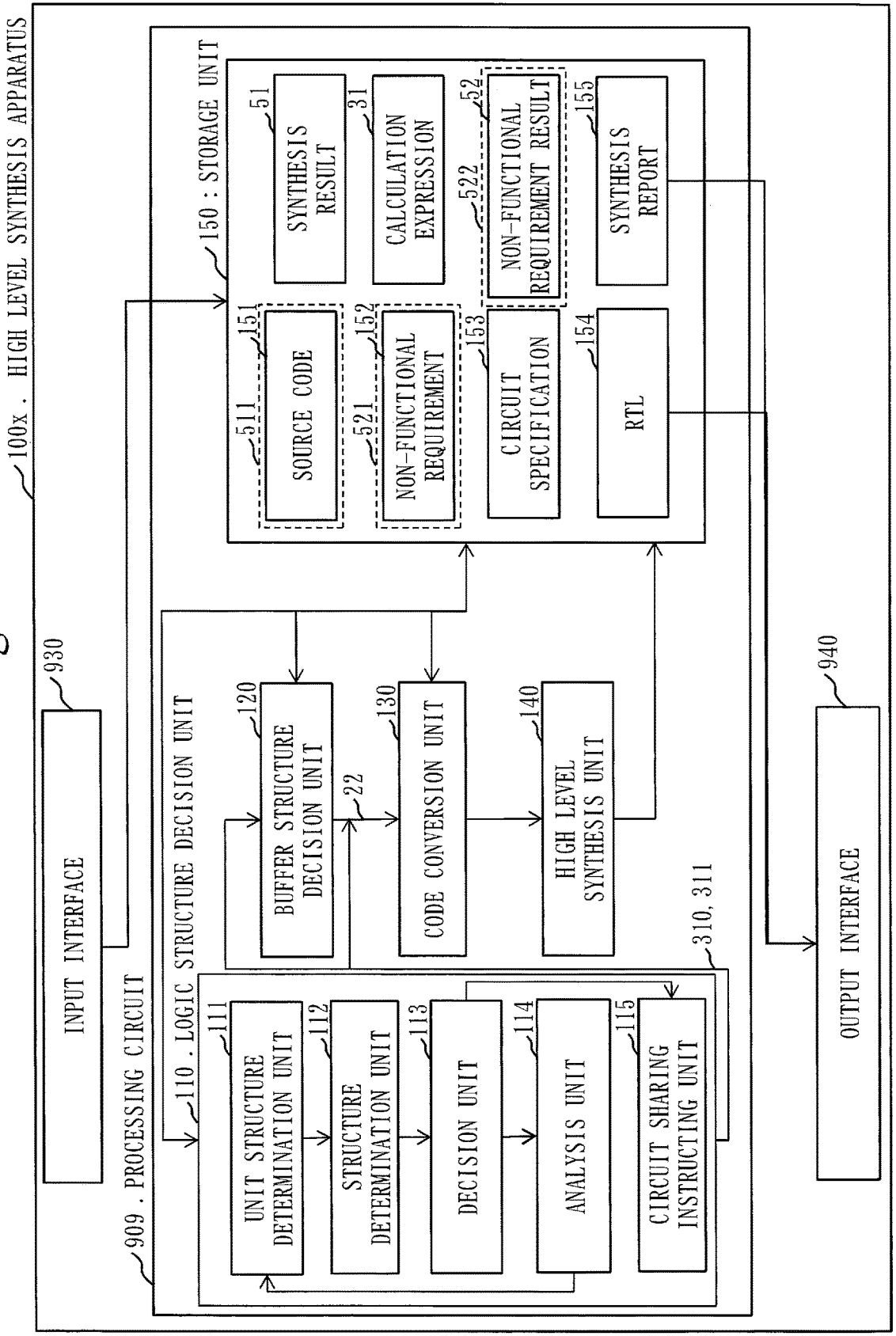
FIG. 15 is a structural diagram illustrating a high level synthesis apparatus 100x according to a modification of embodiment 1.

The structure of high level synthesis apparatus 100x according to the modification of the embodiment will be described with reference to FIG. 15. As illustrated in FIG. 15, the high level synthesis apparatus 100x includes hardware such as a processing circuit 909, the input interface 930, and the output interface 940.

The processing circuit 909 is a special electronic circuit that achieves the functions of the "units" described above and the storage unit 150. Specifically, the processing circuit 909 is a single circuit, a composite circuit, a programmed processor, a parallel-programmed processor, a logic IC, a GA (Gate Array), an ASIC (Application Specific Integrated Circuit), or an FPGA (Field-Programmable Gate Array).

The functions of the "units" may be achieved by one processing circuit 909 or may be achieved by a plurality of processing circuits 909 disposed in a distributed manner.

As another modification, the functions of the high level synthesis apparatus 100 may be achieved by a combination of software and hardware. That is, part of the functions of the high level synthesis apparatus 100 may be achieved by special hardware and the remainder of the functions may be achieved by software.

The processor 910, the storage device 920, and the processing circuit 909 are collectively referred to as "processing circuitry". That is, the functions of the "units" and the storage unit 150 are achieved by the processing circuitry regardless of whether the high level synthesis apparatus 100 has the structures illustrated in FIG. 1 or the structures illustrated in FIG. 10.

It should be noted that the "units" may be read as "processes", "procedures", or "processing". In addition, the functions of the "units" may be achieved by firmware.

Description of Effects of the Embodiment

The high level synthesis apparatus 100 according to the embodiment performs high level synthesis processing by receiving a source code that is an operational description describing the operation of a circuit, a non-functional requirement that determines the characteristic of the circuit, and the circuit specification to be synthesized as inputs, and outputs a hardware description language. The high level synthesis apparatus 100 includes the logic structure decision unit that determines the internal architecture and the parallelization architecture of a parallel execution unit and the buffer structure decision unit that determines the buffer structure between parallelized architectures. In addition, the high level synthesis apparatus 100 has the code conversion unit that generates the source code and the high level synthesis options that achieve the logic architecture determined by the logic structure decision unit and the buffer structure determined by the buffer structure decision unit.

Accordingly, the high level synthesis apparatus 100 according to the embodiment can automatically perform the architecture design for meeting the non-functional requirement and the setting of the source code and the high level synthesis options for achieving the architecture at high speed, which has been conventionally performed manually. In addition, the high level synthesis apparatus 100 according to the embodiment can design an optimum circuit for a short time regardless of the designer.

In addition, since the high level synthesis apparatus 100 according to the embodiment has the analysis unit that makes architecture change for improving the non-functional requirement when the generated circuit does not meet the non-functional requirement, the optimum circuit can be surely designed by making architecture change until the non-functional requirement is met.

In addition, since the high level synthesis apparatus 100 according to the embodiment has the circuit sharing instructing unit capable of determining the circuit sharing degree according the latency that meets the non-functional requirement, the optimum circuit can be designed efficiently.

Although an embodiment of the invention has been described above, any one of the "units" described in the embodiment may be adopted or any combination of them may be adopted. That is, the functional blocks of the high level synthesis apparatus only need to achieve the functions described in the embodiment. The high level synthesis apparatus may be configured by freely combining these functional blocks or may be configured in any block structure. In addition, the high level synthesis apparatus may be a high level synthesis system including a plurality of apparatuses, not one apparatus.

In addition, a plurality of parts of the embodiment may be combined. Alternatively, the embodiment may be practiced partially. Furthermore, all or part of the embodiment may be combined in any way.

The above embodiment is a preferred example essentially, so the embodiment is not intend to restrict the scope of the invention, an application of the invention, and the use thereof and various modifications may be made as necessary.

REFERENCE SIGNS LIST

22: buffer structure, 31: calculation expression, 51: synthesis result, 52: non-functional requirement result, 100, 100x: high level synthesis apparatus, 110: logic structure decision unit, 111: unit structure determination unit, 112: structure determination unit, 113: decision unit, 114: analysis unit, 115: circuit sharing instructing unit, 120: buffer structure decision unit, 130: code conversion unit, 140: high level synthesis unit, 150: storage unit, 151: source code, 152: non-functional requirement, 153: circuit specification, 154: RTL, 155: synthesis report, 310: determined circuit structure, 311: determined intra-unit structure, 510: high level synthesis method, 511: operational description, 515: execution unit, 520: high level synthesis program, 521: threshold, 522: circuit characteristic, 909: processing circuit, 910: processor, 920: storage device, 921: memory, 922: auxiliary storage device, 930: input interface, 940: output interface, 3131: execution unit calculation expression, 3132: circuit structure calculation expression, 3133: DT calculation expression, S100: high level synthesis processing, S110: logic structure decision processing, S120: buffer structure decision processing, S130: code conversion processing, S140: high level synthesis execution processing, S111: unit structure determination processing, S112: structure determination processing, S113: decision processing, S114: analysis processing, S115: circuit sharing instructing processing.

The invention claimed is:

1. A high level synthesis apparatus comprising:
processing circuitry to:
obtain an operational description and to determine a candidate from a plurality of circuit structure types applicable to a plurality of execution units as a structure candidate, the operational description describing an operation of a circuit and including the plurality of execution units;
obtain a threshold of an input data filling period which is a period for which data input to an array used by the plurality of execution units is performed, calculate, as a circuit characteristic of the circuit, an input data filling period of the circuit when the circuit structure of the plurality of execution units is the structure candidate, and output the structure candidate as a determined circuit structure when the circuit characteristic meets the threshold; and perform high level synthesis on the operational description so that the circuit structure of the plurality of execution units becomes the determined circuit structure.

2. The high level synthesis apparatus according to claim 1, wherein the processing circuitry converts the operational description so that the circuit structure of the plurality of execution units becomes the determined circuit structure and to set a high level synthesis option, and performs the high level synthesis using the converted operational description and the high level synthesis option.

3. The high level synthesis apparatus according to claim 1, wherein the processing circuitry determines the structure candidate based on dependency between the plurality of execution units.

4. The high level synthesis apparatus according to claim 3, wherein the processing circuitry decides the dependency between the plurality of execution units based on a variable common to the plurality of execution units.

5. The high level synthesis apparatus according to claim 1, wherein the processing circuitry determines, as an intra-unit structure candidate, a candidate of an intra-unit structure applicable to each of the plurality of execution units, calculates the characteristic of the circuit for each of the intra-unit structure candidate of each of the plurality of execution units and, when the circuit characteristic meets the threshold, outputs the intra-unit structure candidate of each of the plurality of execution units as a determined intra-unit structure, and performs the high level synthesis on the operational description so that the intra-unit structure of each of the plurality of execution units becomes the determined intra-unit structure.

6. The high level synthesis apparatus according to claim 1, wherein the execution unit is a loop description.

7. A high level synthesis method comprising:

obtaining an operational description and determining a candidate from a plurality of circuit structure types applicable to a plurality of execution units as a structure candidate, the operational description describing an operation of a circuit and including the plurality of execution units;

obtaining a threshold of an input data filling period which is a period for which data input to an array used by the plurality of execution units is performed, calculating, as a circuit characteristic, an input data filling period of the circuit when the circuit structure of the plurality of execution units is the structure candidate, and outputting the structure candidate as a determined circuit structure when the circuit characteristic meets the threshold; and performing high level synthesis on the operational description so that the circuit structure of the plurality of execution units becomes the determined circuit structure.

8. A non-transitory computer readable medium storing a high level synthesis program causing a computer to execute, structure determination processing to obtain an operational description and to determine a candidate from a plurality of circuit structure types applicable to a plurality of execution units as a structure candidate, the operational description describing an operation of a circuit and including the plurality of execution units;

decision processing to obtain a threshold of an input data filling period which is a period for which data input to an array used by the plurality of execution units is performed, to calculate, as a circuit characteristic, an input data filling period of the circuit when the circuit structure of the plurality of execution units is the structure candidate, and to output the structure candidate as a determined circuit structure when the circuit characteristic meets the threshold; and high level synthesis processing to perform high level synthesis on the operational description so that the circuit structure of the plurality of execution units becomes the determined circuit structure.

9. The high level synthesis apparatus according to claim 1, wherein the plurality of circuit structure types includes a serial type, a basic form parallel type, and a delay form parallel type.

* * * * *